(12) United States Patent
Lee

(10) Patent No.: US 10,281,784 B1
(45) Date of Patent: May 7, 2019

(54) LIQUID CRYSTAL DISPLAY DEVICE

(71) Applicant: Samsung Display Co. Ltd., Yongin-si, Gyeonggi-do (KR)

(72) Inventor: Chang Soo Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/980,747

(22) Filed: May 16, 2018

(30) Foreign Application Priority Data

Dec. 6, 2017 (KR) .......................... 10-2017-0166743

(51) Int. Cl.
| | | |
|---|---|---|
| *G02F 1/1362* | (2006.01) | |
| *H01L 27/12* | (2006.01) | |
| *G02F 1/1368* | (2006.01) | |
| *G02F 1/1343* | (2006.01) | |
| *G09G 3/36* | (2006.01) | |

(52) U.S. Cl.
CPC ...... *G02F 1/136213* (2013.01); *G02F 1/1368* (2013.01); *G02F 1/134336* (2013.01); *G02F 1/136286* (2013.01); *H01L 27/124* (2013.01); *H01L 27/1255* (2013.01); *G02F 2001/134345* (2013.01); *G02F 2001/136218* (2013.01); *G02F 2201/122* (2013.01); *G02F 2201/123* (2013.01); *G09G 3/3677* (2013.01); *G09G 3/3688* (2013.01); *G09G 2300/0426* (2013.01); *G09G 2310/08* (2013.01)

(58) Field of Classification Search
CPC ............... H01L 27/124; H01L 27/1255; G02F 1/136213
See application file for complete search history.

(56) References Cited

U.S. PATENT DOCUMENTS

| | | | | |
|---|---|---|---|---|
| 9,176,344 | B2* | 11/2015 | Jeong | G02F 1/133707 |
| 2006/0066796 | A1* | 3/2006 | Ohashi | G02F 1/1368 |
| | | | | 349/139 |
| 2010/0007809 | A1* | 1/2010 | You | G02F 1/134309 |
| | | | | 349/37 |
| 2015/0138479 | A1* | 5/2015 | Lee | G02F 1/136286 |
| | | | | 349/44 |

FOREIGN PATENT DOCUMENTS

| | | |
|---|---|---|
| KR | 10-2010-0108202 A | 10/2010 |
| KR | 10-2011-0077899 A | 7/2011 |
| KR | 10-2013-0042529 A | 4/2013 |
| KR | 10-2015-0014197 A | 2/2016 |
| KR | 10-2015-0104255 A | 9/2016 |

* cited by examiner

*Primary Examiner* — Asok K Sarkar
*Assistant Examiner* — Grant S Withers
(74) *Attorney, Agent, or Firm* — Innovation Counsel LLP

(57) ABSTRACT

A liquid crystal display device is provided. According to an exemplary embodiment of the present disclosure, a liquid crystal display (LCD) device may comprise: a substrate; first and second data lines extending in parallel to each other over the substrate; a first thin-film transistor (TFT) disposed on the substrate and connected to the first data line; a second TFT disposed on the substrate and connected to the second data line; a first sub-pixel electrode disposed to overlap the first and second data lines and connected to the first TFT; and a second sub-pixel electrode disposed to overlap the first and second data lines and connected to the second TFT, wherein an overlapping area of the first sub-pixel electrode and the first data line is the same as an overlapping area of the first sub-pixel electrode and the second data line.

20 Claims, 6 Drawing Sheets

LIQUID CRYSTAL DISPLAY DEVICE

This application claims priority to Korean Patent Application No. 10-2017-0166743, filed on Dec. 6, 2017, and all the benefits accruing therefrom under 35 U.S.C. § 119, the disclosure of which is incorporated herein by reference in its entirety.

BACKGROUND

1. Field

The present disclosure relates to a liquid crystal display (LCD) device.

2. Description of the Related Art

A liquid crystal display (LCD) device, which is one of the most commonly used flat panel display devices, includes two substrates where field-generating electrodes such as pixel electrodes and a common electrode are formed and a liquid crystal layer which is disposed between the two substrates. The LCD device generates an electric field in the liquid crystal layer by applying voltages to the field-generating electrodes so as to determine the orientation of liquid crystal molecules in the liquid crystal layer, and displays an image by controlling the polarization of light incident thereupon using the electric field.

A vertical alignment (VA)-mode LCD device has been developed in which the long axes of liquid crystal molecules are aligned perpendicularly to upper and lower substrates in the absence of an electric field.

The VA-mode LCD device may have poorer side visibility than its front visibility. Specifically, the VA-mode LCD device may appear brighter when viewed from a side than when viewed from the front, and as the difference between the brightness of the VA-mode LCD device as viewed from the front and the brightness of the VA-mode LCD device as viewed from a side increases, the visibility of the VA-mode LCD device becomes poorer.

In order to minimize the deterioration of visibility, each pixel of the VA-mode LCD device is divided into two sub-pixels, and the intensity of an electric field is controlled differently in each of the two sub-pixels. In order to control the intensity of an electric field differently in each of the two sub-pixels, two sub-pixel electrodes disposed in the two sub-pixels may be provided with voltages by different data lines.

However, a pair of data lines that respectively provide voltages to a pair of sub-pixel electrodes of a pixel may form different capacitances with the pair of sub-pixel electrodes of the pixel, and as a result, the display quality of the VA-mode LCD device may deteriorate.

SUMMARY

Exemplary embodiments of the present disclosure provide a liquid crystal display (LCD) device capable of minimizing the deterioration of display quality, caused by different capacitances between data lines and sub-pixel electrodes.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, a liquid crystal display (LCD) device may comprise: a substrate, a first data line and a second data line extending in parallel to each other over the substrate, a first thin-film transistor (TFT) disposed on the substrate and connected to the first data line, a second TFT disposed on the substrate and connected to the second data line, a first sub-pixel electrode disposed to overlap the first data line and the second data line, and connected to the first TFT; and a second sub-pixel electrode disposed to overlap the first data line and the second data line, and connected to the second TFT, wherein an overlapping area of the first sub-pixel electrode and the first data line is the same as an overlapping area of the first sub-pixel electrode and the second data line.

In an exemplary embodiment, wherein the first sub-pixel electrode may include a first stem electrode, a plurality of first branch electrodes, which extend from the first stem electrode, a first extension electrode, which is connected to the first TFT, a first connecting electrode, which connects the first stem electrode or the first branch electrodes to the first extension electrode, and a first compensation electrode, which is connected to the first stem electrode or the first branch electrodes.

In an exemplary embodiment, wherein the first connecting electrode may be disposed to intersect the first data line.

In an exemplary embodiment, wherein an overlapping area of the first connecting electrode and the first data line may be the same as an overlapping area of the first compensation electrode and the second data line.

In an exemplary embodiment, the LCD device further may comprise a sustain electrode disposed between the substrate and a layer of the first sub-pixel electrode and the second sub-pixel electrode, wherein the first compensation electrode does not overlap with the sustain electrode.

In an exemplary embodiment, wherein the first sub-pixel electrode may partially overlap with the first data line and the second data line.

In an exemplary embodiment, wherein the second sub-pixel electrode may not overlap with the first data line and the second data line.

In an exemplary embodiment, wherein the second sub-pixel electrode may include a second stem electrode, a plurality of second branch electrodes, which extend from the second stem electrode, a second extension electrode, which is connected to the second TFT, and a second connecting electrode, which connects the second stem electrode or the second branch electrodes to the second extension electrode.

In an exemplary embodiment, wherein the first sub-pixel electrode may include a first field control areas, and the second sub-pixel electrode includes a second field control areas, and wherein an intensity of an electric field formed in the first field control area may be controlled by a voltage provided to the first data line, and an intensity of an electric field formed in the second field control area may be controlled by a voltage provided to the second data line.

In an exemplary embodiment, wherein the first stem electrode and the first branch electrodes may be disposed inside the first field control area.

In an exemplary embodiment, wherein the first extension electrode, the first connecting electrode, and the first compensation electrode may be disposed outside of the first field control area.

In an exemplary embodiment, wherein the first sub-pixel electrode further may include first edge electrodes, which connect ends of the first branch electrodes and extend in the same direction as the first data line and the second data line.

In an exemplary embodiment, wherein capacitance formed between the first sub-pixel electrode and the first data line may be the same as capacitance formed between the first sub-pixel electrode and the second data line.

In an exemplary embodiment, the LCD device may further comprise: a gate line disposed between the first sub-pixel electrode and the second sub-pixel electrode and extending to intersect the first data line and the second data line, wherein the first and second TFTs may be connected to the gate line.

According to another exemplary embodiment of the present disclosure, a liquid crystal display (LCD) device may comprise: a substrate, a first data line and a second data line extending in parallel to each other over the substrate, a first thin film transistor (TFT) disposed on the substrate and connected to the first data line, a second TFT disposed on the substrate and connected to the second data line, and a pixel electrode disposed to overlap the first data line and the second data line, and connected to the first TFT, wherein an overlapping area of the pixel electrode and the first data line may be the same as an overlapping area of the pixel electrode and the second data line.

In an exemplary embodiment, wherein the pixel electrode may include a stem electrode, a plurality of branch electrodes, which extend from the stem electrode, an extension electrode, which is connected to the TFT, a connecting electrode, which connects the stem electrode or the branch electrodes to the extension electrode, and a compensation electrode, which is connected to the stem electrode or the branch electrodes.

In an exemplary embodiment, wherein the connecting electrode may dispose to intersect the first data line.

In an exemplary embodiment, wherein an overlapping area of the connecting electrode and the first data line may be the same as an overlapping area of the compensation electrode and the second data line.

In an exemplary embodiment, wherein the pixel electrode may further include edge electrodes, which connect ends of the branch electrodes and extend in the same direction as the first data line and the second data line.

In an exemplary embodiment, wherein capacitance formed between the pixel electrode and the first data line may be the same as capacitance formed between the pixel electrode and the second data line.

According to the aforementioned and other exemplary embodiments of the present disclosure, an LCD device capable of minimizing the deterioration of display quality, caused by different capacitances between data lines and sub-pixel electrodes can be provided.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

The aspects and features of the present inventive concept and methods for achieving the aspects and features will be apparent by referring to the embodiments to be described in detail with reference to the accompanying drawings. However, the present inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the present inventive concept is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present inventive concept, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present inventive concept will be described with reference to the attached drawings.

Figure 1:
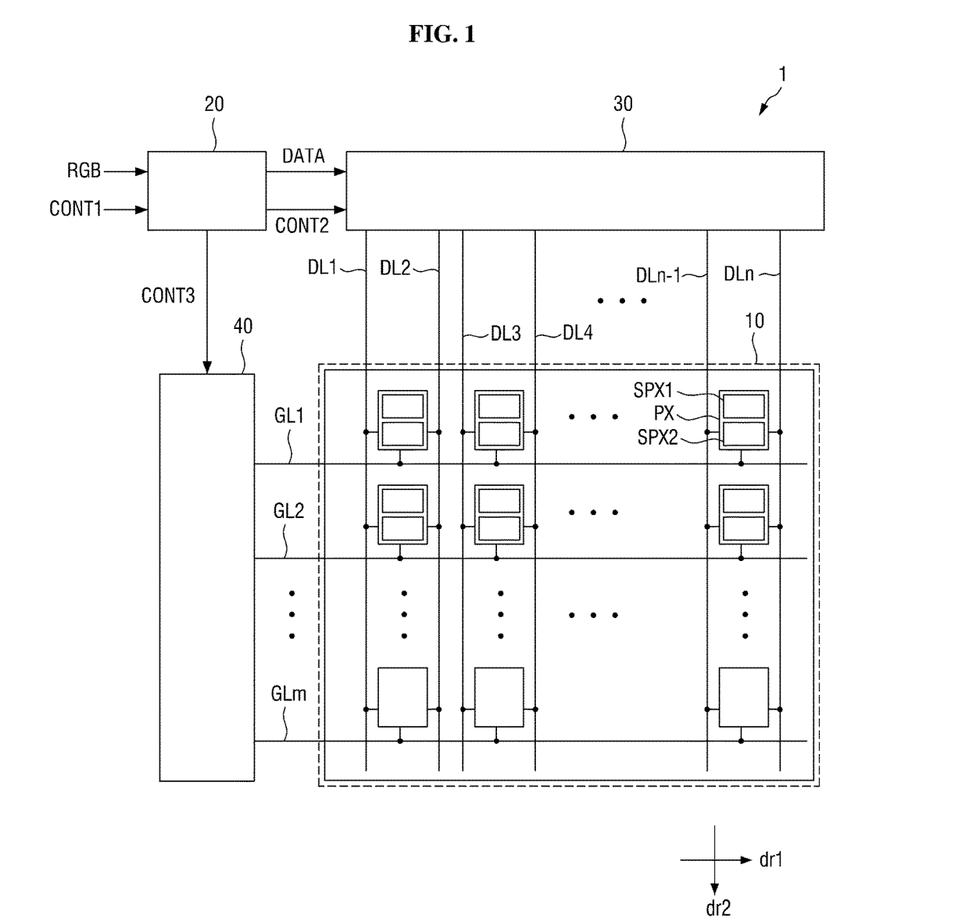
FIG. 1 is a block diagram of a liquid crystal display (LCD) device according to an exemplary embodiment of the present disclosure.

FIG. 1 is a block diagram of a liquid crystal display (LCD) device according to an exemplary embodiment of the present disclosure.

Referring to FIG. 1, an LCD device 1 includes a display panel 10, a timing controller 20, a data driver 30, and a gate driver 40.

The display panel 10 includes a plurality of gate lines GL1 through GLm (where m is a natural number greater than 1), which extend in a first direction dr1, a plurality of data lines DL1 through DLn (where n is a natural number greater than 1), which extend in a second direction dr2 to intersect the gate lines GL1 through GLm, a plurality of first sub-pixels SPX1, and a plurality of second sub-pixels SPX2.

Each of the first sub-pixels SPX1 and each of the second sub-pixels SPX2 may be connected to one gate line, for example, a gate line GLi (where i is a positive integer that satisfies 1≤i≤n), and one data line, for example, a data line DLj (where j is a positive integer that satisfies 1≤j≤n). The gate line GLi may be connected to both first sub-pixels SPX1 and second sub-pixels SPX2. Specifically, a first sub-pixel SPX1 and a second sub-pixel SPX2 disposed adjacent to the first sub-pixel SPX1 and sharing the same gate line (for example, the gate line GLi) with the first sub-pixel SPX1 may form a pixel PX together, in which case, however, the first and second sub-pixels SPX1 and SPX2 of the pixel PX may be connected to different data lines. That is, a pixel PX may include first and second sub-pixels SPX1 and SPX2 and may be connected to one gate line and two data lines, particularly, a pair of adjacent data lines.

The timing controller 20 may receive an image signal RGB and control signals CONT1 for controlling the display of the image signal RGB, such as, for example, a vertical synchronization signal, a horizontal synchronization signal, a main clock signal, and a data enable signal. The timing controller 20 may convert the image signal RGB into an image data signal DATA and may output second and third control signals CONT2 and CONT3.

The data driver 30 may output gray voltages for driving the data lines DL1 through DLn in response to the receipt of the image data signal DATA and the second control signal CONT2 from the timing controller 20.

The gate driver 40 may drive the gate lines GL1 through GLm with one of a gate-on voltage and a gate-off voltage in response to the receipt of the third control signal CONT3 from the timing controller 20.

The gate driver 40 may be implemented as a circuit comprising an amorphous silicon (a-Si) thin-film transistor (TFT) or an oxide semiconductor transistor, and may be formed on the same substrate as the display panel 10.

In the LCD device 1, each pixel PX includes first and second sub-pixels SPX1 and SPX2, and the first and second sub-pixels SPX1 and SPX2 are controlled by different data lines. Thus, the visibility of the LCD device 1 can be improved.

A pixel PX according to an exemplary embodiment of the present disclosure will hereinafter be described.

Figure 2:
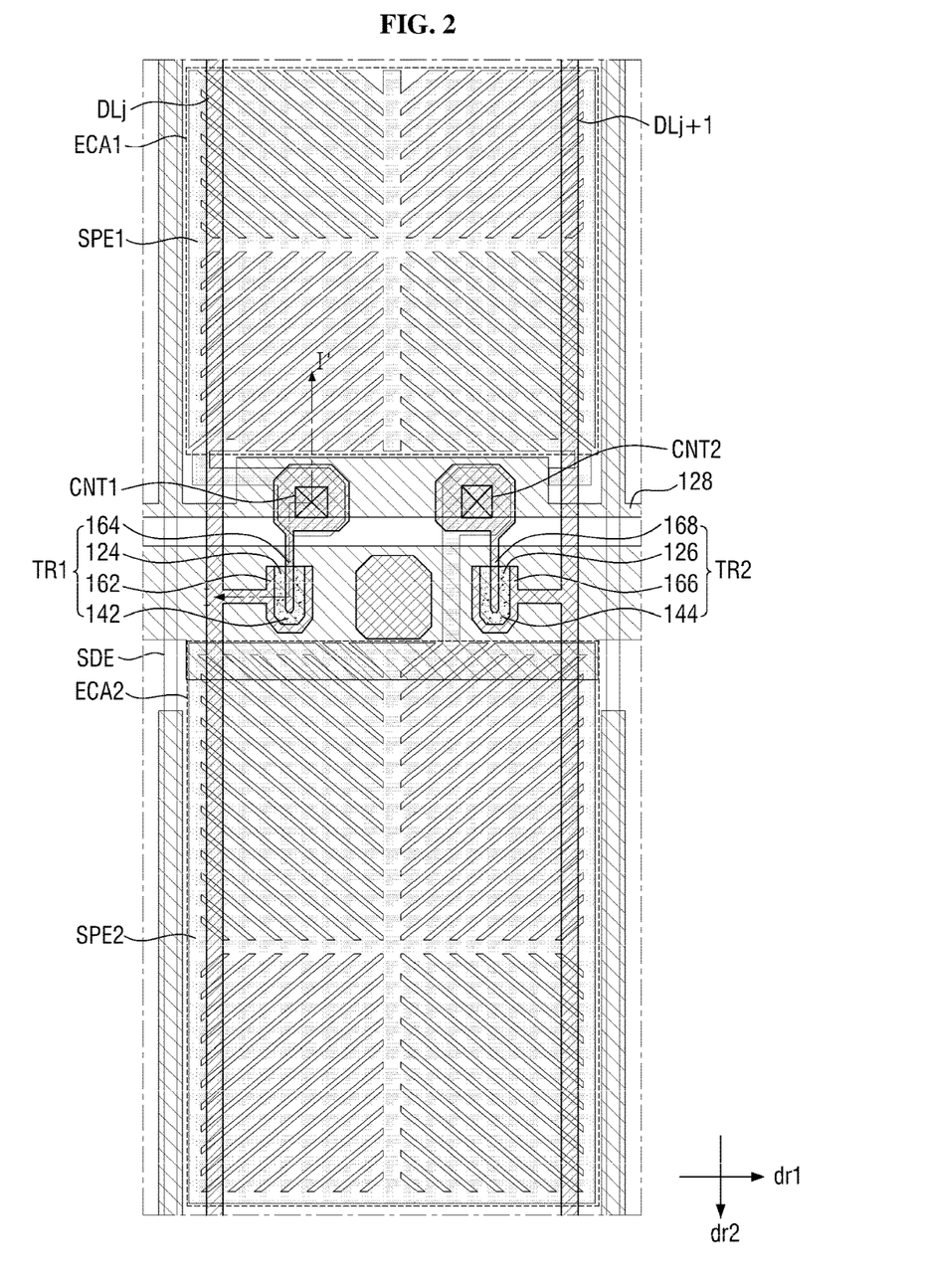
FIG. 2 is a schematic layout view of a pixel according to an exemplary embodiment of the present disclosure.
Figure 3:
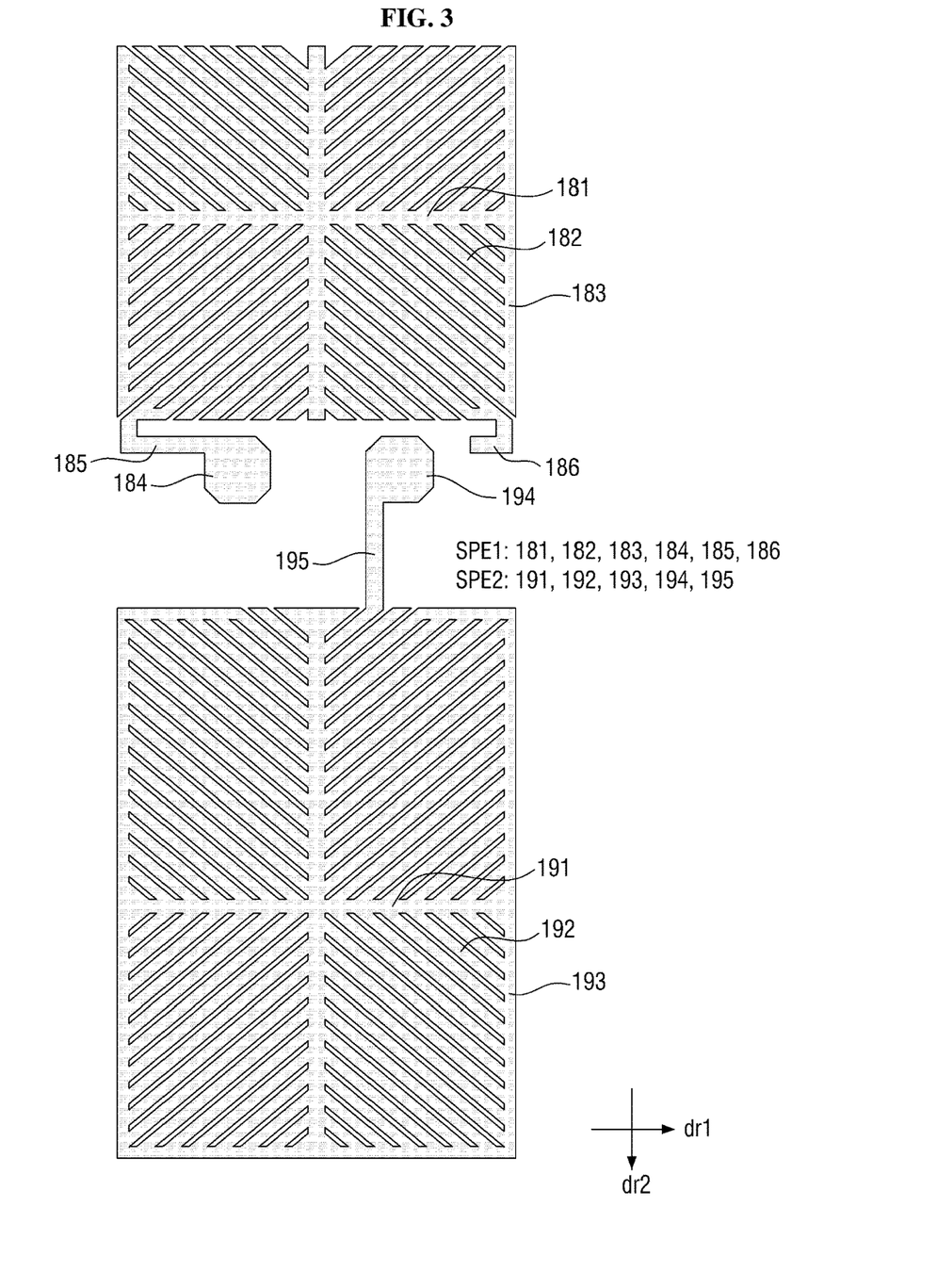
FIG. 3 is a plan view illustrating first and second sub-pixel electrodes of the pixel of FIG. 2.
Figure 4:
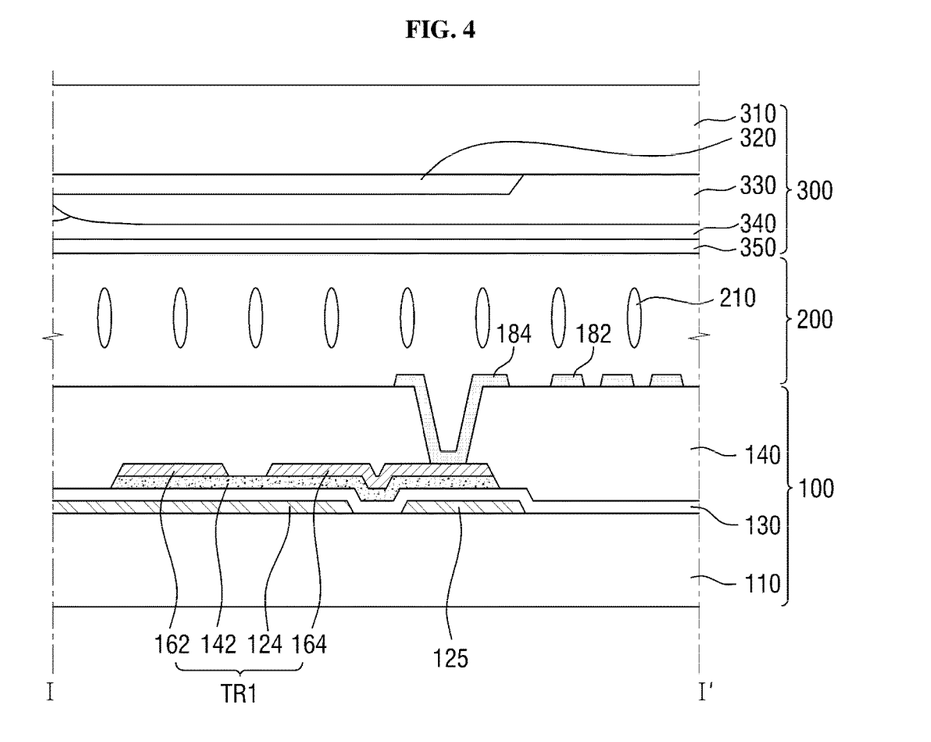
FIG. 4 is a cross-sectional view taken along line I-I' of FIG. 2.

FIG. 2 is a schematic layout view of a pixel according to an exemplary embodiment of the present disclosure, FIG. 3 is a plan view illustrating first and second sub-pixel electrodes of the pixel of FIG. 2, and FIG. 4 is a cross-sectional view taken along line I-I' of FIG. 2.

Referring to FIGS. 2 through 4, the LCD device 1 of FIG. 1 includes a first display substrate 100, a second display substrate 300, and a liquid crystal layer 200 interposed the first display substrate 100 and the second display substrate 300.

Switching elements for controlling the alignment of liquid crystal molecules 210 disposed in the liquid crystal layer 200, such as, for example, first and second TFTs TR1 and TR2, may be disposed on the first display substrate 100. The second display substrate 300 is a substrate disposed to face the first display substrate 100.

The liquid crystal layer 200 may be interposed between the first and second display substrates 100 and 300 and may include a plurality of liquid crystal molecules 210 having dielectric anisotropy. In response to an electric field being applied between the first and second display substrates 100 and 300, the liquid crystal molecules 210 may rotate in a particular direction between the first and second display substrates 100 and 300 and may thus allow or block the transmission of light pass therethrough. As used herein, the term "rotate" or "rotation" not only means that the liquid crystal molecules 210 actually rotate, but also means that the alignment of the liquid crystal molecules 210 changes due to an electric field.

The LCD device 1 of FIG. 1 includes a plurality of pixels PX, which are arranged in a matrix form. The plurality of pixels PX may be basic units for displaying colors, and the gray levels of the plurality of pixels PX may be independently controllable. Each of the plurality of pixels PX includes two regions that can control the intensity of an electric field formed in the liquid crystal layer 200 differently, i.e., first and second field control areas ECA1 and ECA2. As described above with reference to FIG. 1, each of the plurality of pixels PX includes first and second sub-pixels SPX1 and SPX2. The first sub-pixel SPX1 includes elements for controlling an electric field formed in the first field control area ECA1, and the second sub-pixel SPX2 includes elements for controlling an electric field formed in the second field control area ECA2.

The first display substrate 100 will hereinafter be described.

The first display substrate 100 includes a first base substrate 110. The first base substrate 110 may be a transparent insulating substrate. For example, the first base substrate 110 may be a glass substrate, a quartz substrate, a transparent resin substrate, or the like.

In some exemplary embodiments, the first base substrate 110 may be curved in one direction. In some other exemplary embodiments, the first base substrate 110 may have flexibility. That is, the first base substrate 110 may be rollable, foldable, or bendable.

A gate line GLi, a first gate electrode 124, a second gate electrode 126, and a sustain electrode 128 are disposed on the first base substrate 110.

The gate line GLi transmits a gate voltage, which controls the first and second TFTs TR1 and TR2. The gate line GLi may extend in the first direction dr1.

The gate voltage may be provided from the gate driver 40 of FIG. 1 and may have a variable level. The turning on or off of the first and second TFTs TR1 and TR2 may be controlled according to the level of the gate voltage.

The first and second gate electrodes 124 and 126 may be formed in one piece using the same material with the gate line GLi as parts of the gate line GLi. Specifically, the first and second gate electrodes 124 and 126 may refer to parts of the gate line GLi that overlap with the first and second TFTs TR1 and TR2. The first and second gate electrodes 124 and 126 may be elements of the first and second TFTs TR1 and TR2, respectively.

In some exemplary embodiments, the first and second gate electrodes 124 and 126 may be formed as a single protrusion from the gate line GLi.

The sustain electrode 128 may be disposed on the first base substrate 110 and may be disposed in the same layer as the gate line GLi. The sustain electrode 128 may generally extend in the first direction dr1, but may include portions extending in the second direction dr2 along the boundaries of the first and second field control areas ECA1 and ECA2.

The sustain electrode 128 may be disposed adjacent to, or may overlap with, the edges of first or second sub-pixel electrodes SPE1 and SPE2, which will be described later, and a predetermined capacitance may be formed between the sustain electrode 128 and the first or second sub-pixel electrode SPE1 or SPE2. Accordingly, a sudden drop in the voltage provided to the first and second sub-pixel electrodes SPE1 and SPE2 can be prevented.

The gate line GLi, the first and second gate electrodes 124 and 126, and the sustain electrode 128 may be formed of the same material. For example, the gate line GLi, the first and second gate electrodes 124 and 126, and the sustain electrode 128 may be formed of an aluminum (Al) or an Al-based metal such as an Al alloy, a silver (Ag) or a Ag-based metal such as an Ag alloy, a copper (Cu) or a Cu-based metal such as a Cu alloy, a molybdenum (Mo) or a Mo-based metal such as a Mo alloy, chromium (Cr), tantalum (Ta), or titanium (Ti). The gate line GLi, the first and second gate electrodes 124 and 126, and the sustain electrode 128 may have a single-layer structure or may have a multilayer structure including at least two conductive films having different physical properties.

A first insulating layer 130 is disposed on the gate line GLi, the first and second gate electrodes 124 and 126, and the sustain electrode 128. The first insulating layer 130 may be formed of an insulating material such as, for example, silicon nitride or silicon oxide. The first insulating layer 130 may have a single-layer structure or may have a multilayer structure including at least two insulating films having different physical properties.

First and second semiconductor patterns 142 and 144 are disposed on the first insulating layer 130.

The first semiconductor pattern 142 is disposed to at least partially overlap with the first gate electrode 124, and the second semiconductor pattern 144 is disposed to at least partially overlap with the second gate electrode 126. As illustrated in FIG. 2, the first and second semiconductor patterns 142 and 144 may form a single layer together.

The first and second semiconductor patterns 142 and 144 may be formed of a-Si, polycrystalline silicon, or an oxide semiconductor.

Although not specifically illustrated, in some exemplary embodiments, parts of the first and second semiconductor patterns 142 and 144 may be doped with a high concentration of n-type impurities or p-type impurities.

A first data line DLj, a second data line DLj+1, a first source electrode 162, a first drain electrode 164, a second source electrode 166, and a second drain electrode 168 are disposed on the first and second semiconductor patterns 142 and 144 and the first insulating layer 130.

The first and second data lines DLj and DLj+1 of FIG. 2 may correspond to two arbitrary data lines that are arranged next to each other, among the data lines DL1 through DLn illustrated in FIG. 1, and for convenience, the two arbitrary data lines are referred to as the first and second data lines DLj and DLj+1.

The first and second data lines DLj and DLj+1 may extend in the second direction dr2 to intersect the gate line GLi.

The first and second data lines DLj and DLj+1 may be insulated from the gate line GLi, the first and second gate electrodes 124 and 126, and the sustain electrode 128 by the first insulating layer 130.

The first data line DLj may provide a first data voltage to the first source electrode 162. The second data line DLj+1 may provide a second data voltage to the second source electrode 166. The first and second data voltages may be provided from the data driver 30 of FIG. 1 and may have different levels. The intensity of an electric field formed in the first field control area ECA1 may be decided by the level of the first data voltage, and the intensity of an electric field formed in the second field control area ECA2 may be decided by the level of the second data voltage.

The first source electrode 162 may be branched off from the first data line DLj so as to at least partially overlap with the first gate electrode 124. Accordingly, the first source electrode 162 may receive the first data voltage from the first data line DLj.

The second source electrode 166 may be branched off from the second data line DLj+1 so as to at least partially overlap with the second gate electrode 126, but the present disclosure is not limited thereto. Accordingly, the second source electrode 166 may receive the second data voltage from the second data line DLj+1.

As illustrated in FIG. 2, the first drain electrode 164 may be spaced apart from the first source electrode 162 so as for the first semiconductor pattern 142 to be exposed and may at least partially overlap with the first gate electrode 124. For example, the first drain electrode 164 may be formed to be a predetermined distance apart from, and surrounded by, the first source electrode 162, which is formed in a U shape.

As illustrated in FIG. 2, the second drain electrode 168 may be spaced apart from the second source electrode 166 so as for the second semiconductor pattern 144 to be exposed and may at least partially overlap with the second gate electrode 126. For example, the second drain electrode 168 may be formed to be a predetermined distance apart from, and surrounded by, the second source electrode 166, which is formed in a U shape.

The first gate electrode 124, the first semiconductor pattern 142, the first source electrode 162, and the first drain electrode 164 form the first TFT TR1. That is, if a sufficient voltage is provided to the first gate electrode 124, a channel may be formed in the first semiconductor pattern 142, and a voltage provided to the first source electrode 162 may also be provided to the first drain electrode 164.

The second gate electrode 126, the second semiconductor pattern 144, the second source electrode 166, and the second drain electrode 168 form the second TFT TR2. That is, if a sufficient voltage is provided to the second gate electrode 126, a channel may be formed in the second semiconductor pattern 144, and a voltage provided to the second source electrode 166 may also be provided to the second drain electrode 168.

The first drain electrode 164 may be electrically connected to the first sub-pixel electrode SPE1 via a first contact hole CNT1, which will be described later. The second drain electrode 168 may be electrically connected to the second sub-pixel electrode SPE2 via a second contact hole CNT2, which will be described later.

The first and second data lines DLj and DLj+1, the first source electrode 162, the first drain electrode 164, the second source electrode 166, and the second drain electrode 168 may be formed of the same material. For example, the first and second data lines DLj and DLj+1, the first source electrode 162, the first drain electrode 164, the second source electrode 166, and the second drain electrode 168 may be formed of Al or an Al-based metal such as an Al alloy, Ag or a Ag-based metal such as an Ag alloy, Cu or a Cu-based metal such as a Cu alloy, Mo or a Mo-based metal such as a Mo alloy, Cr, Ta, or Ti. The first and second data lines DLj and DLj+1, the first source electrode 162, the first drain electrode 164, the second source electrode 166, and the second drain electrode 168 may have a single-layer structure or may have a multilayer structure including at least two conductive films having different physical properties.

A pixel PX includes first and second sub-pixels SPX1 and SPX2, as illustrated in FIG. 1, and each of the first and second sub-pixels SPX1 and SPX2 includes the first and second field control areas ECA1 and ECA2, respectively. Thus, the liquid crystal molecules 210 can be tilted at various angles. Accordingly, the difference between the front gray level and the side gray level of the LCD device 1 of FIG. 1 can be minimized. In other words, the visibility of the LCD device 1 of FIG. 1 can be improved.

A second insulating layer 140 is disposed on the first insulating layer 130 and the first and second TFTs TR1 and TR2. The second insulating layer 140 may be formed of an insulating material. For example, the second insulating layer 140 may be an organic layer comprising an organic material. The second insulating layer 140 may planarize any height differences formed by elements disposed between the second insulating layer 140 and the first base substrate 110. In other words, the top surface of the second insulating layer 140 may be substantially flat.

The first and second contact holes CNT1 and CNT2 may be disposed in the second insulating layer 140 to penetrate the second insulating layer 140.

Specifically, the first contact hole CNT1, which exposes part of the first drain electrode 164 along a vertical direction with respect to the top surface of the first base substrate 110, may be formed in the second insulating layer 130. Part of the first drain electrode 164 and the first sub-pixel electrode SPE1, which is disposed above the second insulating layer 140, may be physically connected to each other via the first contact hole CNT1.

Also, the second contact hole CNT2, which exposes part of the second drain electrode 168 along the vertical direction with respect to the top surface of the first base substrate 110, may be formed in the second insulating layer 140. Part of the second drain electrode 168 and the second sub-pixel electrode SPE2, which is disposed above the second insulating layer 140, may be electrically connected to each other via the second contact hole CNT2.

The first and second sub-pixel electrodes SPE1 and SPE2, and a shielding electrode SDE are disposed on the second insulating layer 140. The first and second sub-pixel electrodes SPE1 and SPE2 and the shielding electrode SDE may be disposed not to overlap with one another in a plan view.

The first sub-pixel electrode SPE1 may be electrically connected to the first drain electrode 164 via the first contact hole CNT1 and may receive the first data voltage.

The second sub-pixel electrode SPE2 may be electrically connected to the second drain electrode 168 via the second contact hole CNT2 and may receive the second data voltage.

The first sub-pixel electrode SPE1 may be generally disposed within the first field control area ECA1, but may include a first portion extended to overlap with the first contact hole CNT1 and a second portion extended to be symmetrical to the first portion, in order to be connected to the first drain electrode 164. Also, the first sub-pixel electrode SPE1 may include openings in which no transparent conductive material is disposed. Due to the presence of the openings, regular patterns are formed on the first sub-pixel electrode SPE1, and the tilt direction and tilt degree of liquid crystal molecules 210 disposed to overlap with the first sub-pixel electrode SPE1 may be controlled by the shape and the patterns of the first sub-pixel electrode SPE1.

Specifically, the first sub-pixel electrode SPE1 includes a first stem electrode 181, a plurality of first branch electrodes 182, a plurality of first edge electrodes 183, a first extension electrode 184, a first connecting electrode 185, and a first compensation electrode 186.

The first stem electrode 181 may extend in the first and/or second direction dr1 and/or dr2. The first branch electrodes 182 may extend from the first stem electrode 181 in a diagonal direction with respect to the first or second direction dr1 or dr2. The first edge electrodes 183 may connect the ends of the first branch electrodes 182 and may extend in the second direction dr2. The first extension electrode 184 may be disposed to overlap with a region in which the first contact hole CNT1 is formed.

The first connecting electrode 185 may be disposed to connect the first stem electrode 181, the first branch electrodes 182, and/or the first edge electrodes 183 to the first extension electrode 184. In the exemplary embodiment of FIGS. 2 through 4, the first connecting electrode 185 may be connected to the first edge electrodes 183.

The first connecting electrode 185 may be disposed to intersect the first data line DLj. Thus, the first connecting electrode 185 and the first data line DLj may form a predetermined capacitance together.

The first compensation electrode 186 may be disposed to connect the first stem electrode 181, the first branch electrodes 182, and/or the first edge electrodes 183. In the exemplary embodiment of FIGS. 2 through 4, the first connecting electrode 185 may be connected to the first edge electrodes 183.

The first compensation electrode 186 may be disposed to intersect the second data line DLj+1. Thus, the first compensation electrode 186 and the second data line DLj+1 may form a predetermined capacitance together.

That is, in order to prevent display quality from being degraded by the capacitance formed between the first connecting electrode 185 and the first data line DLj, the first compensation electrode 186 may form capacitance together with the second data line DLj+1. To this end, the overlapping area of the first compensation electrode 186 and the second data line DLj+1 may be the same as the overlapping area of the first connecting electrode 185 and the first data line DLj.

In the exemplary embodiment of FIGS. 2 through 4, the first compensation electrode 186 may have the same shape as part of the first connecting electrode 185, but may be formed not to overlap with the sustain electrode 128.

The second sub-pixel electrode SPE2 may be generally disposed within the second field control area ECA2, but may include a first portion overlapping with the second contact hole CNT2 and a second portion extended in order to be connected to the second drain electrode 168. Also, the second sub-pixel electrode SPE2 may include openings in which no transparent conductive material is disposed. Due to the presence of the openings, regular patterns are formed on the second sub-pixel electrode SPE2, and the tilt direction and tilt degree of liquid crystal molecules 210 disposed to overlap with the second sub-pixel electrode SPE2 may be controlled by the shape and the patterns of the second sub-pixel electrode SPE2. In the exemplary embodiment of FIGS. 2 through 4, the second sub-pixel electrode SPE2 may have patterns including a plurality of branches extending outwardly from the center of the second field control area ECA2, but the present disclosure is not limited thereto.

Specifically, the second sub-pixel electrode SPE2 includes a second stem electrode 191, a plurality of second branch electrodes 192, a plurality of second edge electrodes 193, a second extension electrode 194, and a second connecting electrode 195.

The second stem electrode 191 may extend in the first and/or second direction dr1 and/or dr2. The second branch electrodes 192 may extend from the second stem electrode 191 in a diagonal direction with respect to the first or second direction dr1 or dr2. The second edge electrodes 193 may connect the ends of the second branch electrodes 192 and may extend in the second direction dr2. The second edge electrodes 193 may further connect the ends of the second branch electrodes 192 and may extend in the first direction dr1. The second extension electrode 194 may be disposed to overlap with a region in which the second contact hole CNT2 is formed.

The second connecting electrode 195 may be disposed to connect the second stem electrode 191, the second branch electrodes 192, and/or the second edge electrodes 193 to the second extension electrode 194. In the exemplary embodiment of FIGS. 2 through 4, the second connecting electrode 195 may be connected to the second branch electrodes 192.

The second connecting electrode 195, unlike the first connecting electrode 185, may be disposed not to intersect the first data line DLj. Thus, the second connecting electrode 195 may not form any capacitance together with the first data line DLj.

The shielding electrode SDE may be disposed to partially overlap the sustain electrode 128, particularly, in a region of the sustain electrode 128 that extends in the first direction dr1. The shielding electrode SDE may prevent light leakage by preventing unintended changes in the alignment of liquid crystal molecules 210 disposed to overlap with the shielding electrode SDE, and may clearly define the boundaries between the plurality of pixels PX.

The first and second sub-pixel electrodes SPE1 and SPE2 and the shielding electrode SDE may be formed of a transparent conductive material such as indium tin oxide (ITO), indium zinc oxide (IZO), indium tin zinc oxide (ITZO), or aluminum (Al)-doped zinc oxide (AZO).

A first alignment film (not illustrated) may be additionally disposed on the first and second sub-pixel electrodes SPE1 and SPE2 and the shielding electrode SDE. The first alignment film may control the initial alignment angle of the liquid crystal molecules 210 in the liquid crystal layer 200.

The second display substrate 300 will hereinafter be described.

The second display substrate 300 includes a second base substrate 310, a light-shielding member 320, a color filter layer 330, an overcoat layer 340, and a common electrode 350.

The second base substrate 310 is disposed to face the first base substrate 110. The second base substrate 310 may be durable enough to withstand external shocks. The second base substrate 310 may be a transparent insulating substrate. For example, the second base substrate 310 may be a glass substrate, a quartz substrate, a transparent resin substrate, or the like. The second base substrate 310 may be of a flat plate shape, but may be curved in a particular direction.

The light-shielding member 320 is disposed on a surface of the second base substrate 310 that faces the first display substrate 100.

The light-shielding member 320 may be disposed to overlap with the gate line GLi, the data line DL, the first and second TFTs TR1 and TR2, and the first and second contact holes CNT1 and CNT2 and may block the transmission of light.

The color filter layer 330 is disposed on a surface of the light-shielding member 320 that faces the first display substrate 100.

The color filter layer 330 may comprise a photosensitive organic composition containing a pigment for realizing a color, and may include any one of red, green, and blue pigments. For example, the color filter layer 330 may include a plurality of color filters, and one of the plurality of color filters may display one of three primary colors, i.e., red, green, and blue colors. However, the present disclosure is not limited to this example. Alternatively, the plurality of color filters may display any one of cyan, magenta, yellow, and white colors.

In the exemplary embodiment of FIGS. 2 through 4, the color filter layer 330 may be formed on the second display substrate 300, but the present disclosure is not limited thereto. That is, in some exemplary embodiments, the color filter layer 330 may be formed on the first display substrate 100.

The overcoat layer 340 is disposed on a surface of the color filter layer 330 that faces the first display substrate 100. The overcoat layer 340 can alleviate height differences formed by the light-shielding member 320 and the color filter layer 330. In some exemplary embodiments, the overcoat layer 340 may not be provided.

The common electrode 350 is disposed on a surface of the overcoat layer 340 that faces the first display substrate 100.

The common electrode 350 may be formed as an unpatterned plate over the entire surface of the second base substrate 310. A common voltage supplied from the outside may be applied to the common electrode 350 to form an electric field in the liquid crystal layer 200 together with the first and second sub-pixel electrodes SPE1 and SPE2. However, in some exemplary embodiments, openings may be formed on the common electrode 350 so that the common electrode 350 can have particular patterns.

The common voltage may be provided from the outside, and the level of the common voltage may be uniformly maintained while the liquid crystal display 1 is operating. Accordingly, an electric field may be formed by a voltage difference between the first sub-pixel electrode SPE1 and the common electrode 350, which are disposed to overlap with each other, or between the second sub-pixel electrode SPE2 and the common electrode 350, which are disposed to overlap with each other. The liquid crystal molecules 210 may be rotated or tilted by the electric field.

On the other hand, in some exemplary embodiments, the shielding electrode SDE may be provided with a voltage having substantially the same level as the common voltage. Accordingly, during the operation of the LCD device 1, an electric field having directivity may not be formed in part of the liquid crystal layer 200 between the shielding electrode SDE and the common electrode 350, which are disposed to overlap with each other. Since a voltage having the same level as the common voltage is provided to the shielding electrode SDE and the common electrode 350, no potential difference is formed. Accordingly, the liquid crystal molecules 210 in the space between the shielding electrode SDE and the common electrode 350, which are disposed to overlap with each other, may not be rotated or tilted, and may be maintained in the same state as when the LCD device is turned off. For example, the transmission of light can be blocked.

A second alignment film (not illustrated) may be disposed on a surface of the common electrode 350 that faces the first display substrate 120. The second alignment film, like the first alignment film, may control the initial alignment angle of the liquid crystal molecules 210 injected into the liquid crystal layer 200. The second alignment film may not be provided.

The liquid crystal layer 200 will hereinafter be described.

The liquid crystal layer 200 may include the liquid crystal molecules 210 having dielectric anisotropy and refractive anisotropy. The liquid crystal molecules 210 may be aligned in a vertical direction with respect to the first and second display substrates 100 and 200 in the absence of an electric field in the liquid crystal layer 200. In response to an electric field being formed between the first and second display substrates 100 and 200, the liquid crystal molecules 210 may be tilted or rotated in a particular direction and may thus change the polarization of light.

Figure 5:
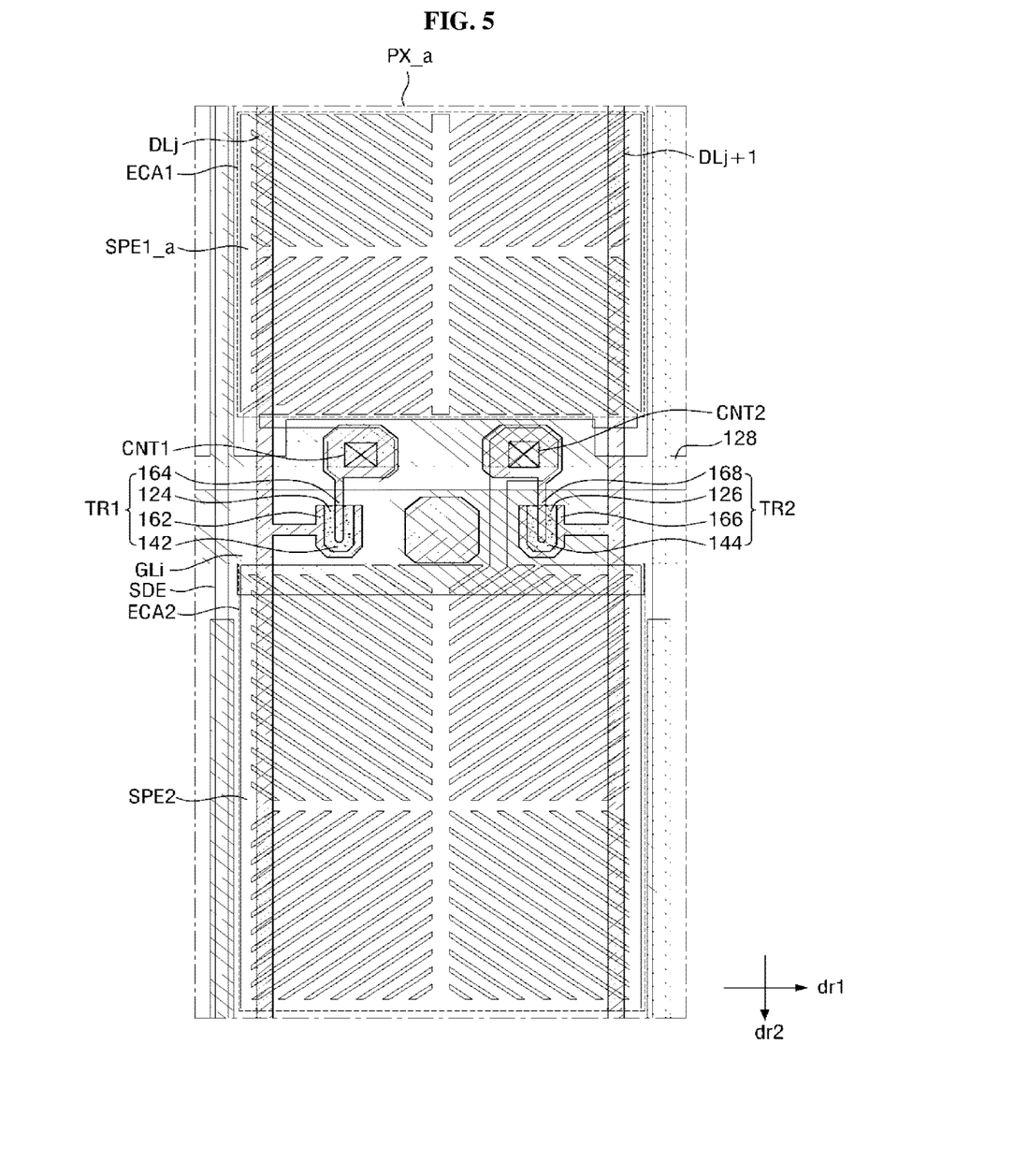
FIG. 5 is a schematic layout view of a pixel according to another exemplary embodiment of the present disclosure.
Figure 6:
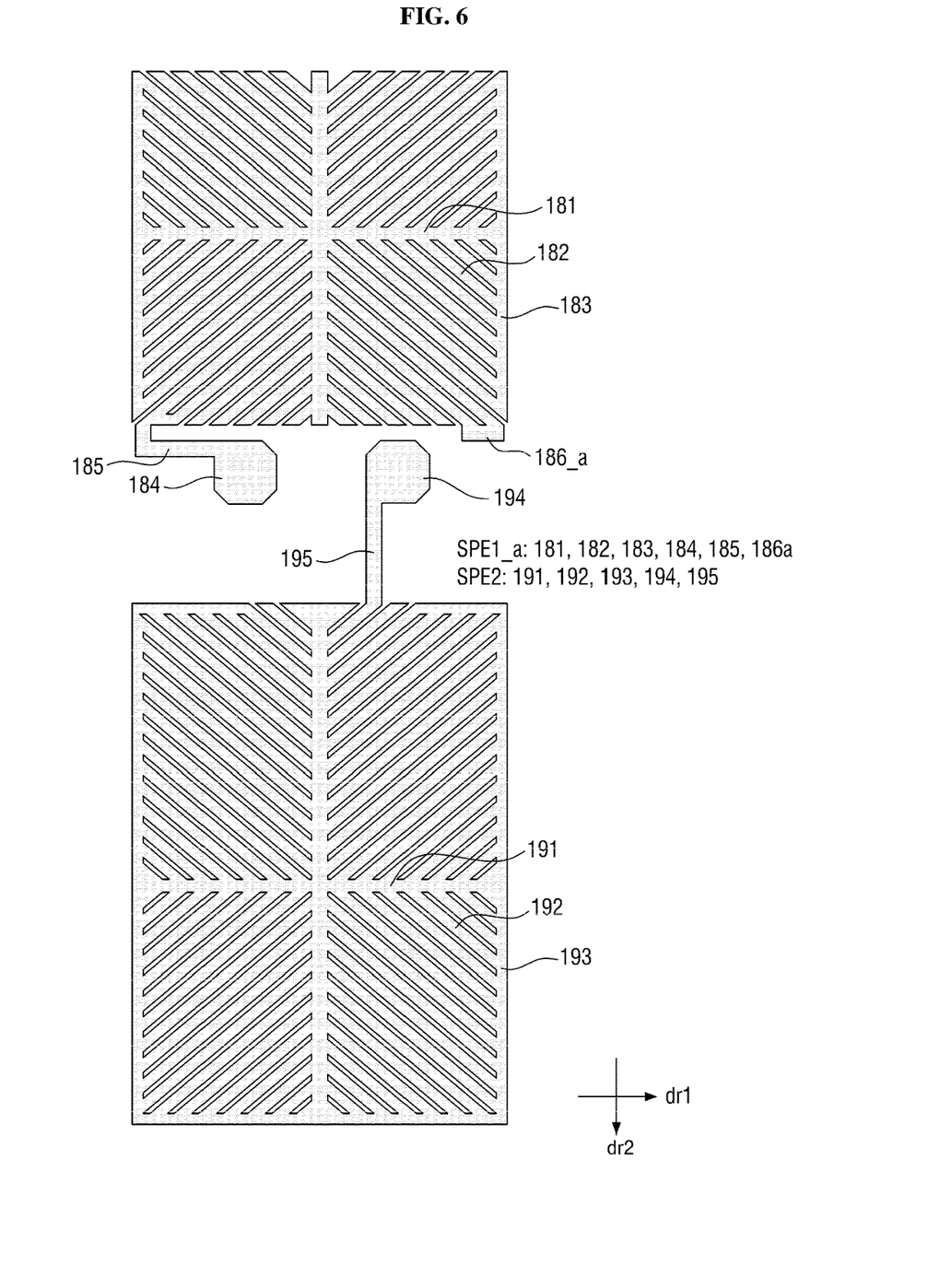
FIG. 6 is a plan view illustrating first and second sub-pixel electrodes of the pixel of FIG. 5.

FIG. 5 is a schematic layout view of a pixel according to another exemplary embodiment of the present disclosure, and FIG. 6 is a plan view illustrating first and second sub-pixel electrodes of the pixel of FIG. 5.

A pixel PX_a of FIGS. 5 and 6 differs from the pixel PX of FIGS. 2 through 4 in the shape of a first compensation electrode 186_*a*. In FIGS. 1 through 6, like reference numerals indicate like elements, and thus, detailed descriptions thereof will be omitted.

Referring to FIGS. 5 and 6, the pixel PX_a includes first and second sub-pixel electrodes SPE1_a and SPE2.

The first sub-pixel electrode SPE1_a includes a first stem electrode 181, a plurality of first branch electrodes 182, a plurality of first edge electrodes 183, a first extension electrode 184, a first connecting electrode 185, and the first compensation electrode 186_a.

The first compensation electrode 186_a, unlike the first compensation electrode 186 of FIGS. 2 through 4, may be formed to have a different shape from the first connecting electrode 185. That is, in the exemplary embodiment of FIGS. 5 and 6, like in the exemplary embodiment of FIGS. 2 through 4, the capacitance formed by the first compensation electrode 186_a and a second data line DLj+1 and the capacitance formed by the first connecting electrode 185 and a first data line DLj are the same. However, the first compensation electrode 186_a has a different shape from the first compensation electrode 186 of FIGS. 2 through 4. In other words, the first compensation electrode 186_a may be allowed to have a different shape from the first connecting electrode 185 as long as it can form a predetermined capacitance together with the second data line DLj+1. For example, the first compensation electrode 186_a may be formed to protrude integrally from the first edge electrodes 183 to have a same protrusion width along the second direction dr2 with a width of the first connecting electrode 185 along the second direction dr2.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A liquid crystal display (LCD) device comprising:
a substrate;
a first data line and a second data line extending in parallel to each other over the substrate;
a first thin-film transistor (TFT) disposed on the substrate and connected to the first data line;
a second TFT disposed on the substrate and connected to the second data line;
a first sub-pixel electrode disposed to overlap the first data line and the second data line, and connected to the first TFT; and
a second sub-pixel electrode disposed to overlap the first data line and the second data line, and connected to the second TFT,
wherein an overlapping area of the first sub-pixel electrode and the first data line is the same as an overlapping area of the first sub-pixel electrode and the second data line.

2. The LCD device of claim 1, wherein the first sub-pixel electrode includes a first stem electrode, a plurality of first branch electrodes, which extend from the first stem electrode, a first extension electrode, which is connected to the first TFT, a first connecting electrode, which connects the first stem electrode or the first branch electrodes to the first extension electrode, and a first compensation electrode, which is connected to the first stem electrode or the first branch electrodes.

3. The LCD device of claim 2, wherein the first connecting electrode is disposed to intersect the first data line.

4. The LCD device of claim 3, wherein an overlapping area of the first connecting electrode and the first data line is the same as an overlapping area of the first compensation electrode and the second data line.

5. The LCD device of claim 2, further comprising:
a sustain electrode disposed between the substrate and a layer of the first sub-pixel electrode and the second sub-pixel electrode,
wherein the first compensation electrode does not overlap with the sustain electrode.

6. The LCD device of claim 2, wherein the first sub-pixel electrode partially overlaps with the first data line and the second data line.

7. The LCD device of claim 6, wherein the second sub-pixel electrode does not overlap with the first data line and the second data line.

8. The LCD device of claim 2, wherein the second sub-pixel electrode includes a second stem electrode, a plurality of second branch electrodes, which extend from the second stem electrode, a second extension electrode, which is connected to the second TFT, and a second connecting electrode, which connects the second stem electrode or the second branch electrodes to the second extension electrode.

9. The LCD device of claim 2, wherein the first sub-pixel electrode includes a first field control areas, and the second sub-pixel electrode includes a second field control areas, and
wherein an intensity of an electric field formed in the first field control area is controlled by a voltage provided to the first data line, and an intensity of an electric field formed in the second field control area is controlled by a voltage provided to the second data line.

10. The LCD device of claim 9, wherein the first stem electrode and the first branch electrodes are disposed inside the first field control area.

11. The LCD device of claim 10, wherein the first extension electrode, the first connecting electrode, and the first compensation electrode are disposed outside of the first field control area.

12. The LCD device of claim 2, wherein the first sub-pixel electrode further includes first edge electrodes which connect ends of the first branch electrodes and extend in the same direction as the first data line and the second data line.

13. The LCD device of claim 1, wherein capacitance formed between the first sub-pixel electrode and the first data line is the same as capacitance formed between the first sub-pixel electrode and the second data line.

14. The LCD device of claim 1, further comprising:
a gate line disposed between the first sub-pixel electrode and the second sub-pixel electrode and extending to intersect the first data line and the second data line,
wherein the first and second TFTs are connected to the gate line.

15. A liquid crystal display (LCD) device comprising:
a substrate;
a first data line and a second data line extending in parallel to each other over the substrate;
a first thin film transistor (TFT) disposed on the substrate and connected to the first data line;
a second TFT disposed on the substrate and connected to the second data line; and
a pixel electrode disposed to overlap the first data line and the second data line, and connected to the first TFT,
wherein an overlapping area of the pixel electrode and the first data line is the same as an overlapping area of the pixel electrode and the second data line.

16. The LCD device of claim 15, wherein the pixel electrode includes a stem electrode, a plurality of branch electrodes, which extend from the stem electrode, an extension electrode, which is connected to the TFT, a connecting electrode, which connects the stem electrode or the branch electrodes to the extension electrode, and a compensation electrode, which is connected to the stem electrode or the branch electrodes.

17. The LCD device of claim 16, wherein the connecting electrode is disposed to intersect the first data line.

18. The LCD device of claim 17, wherein an overlapping area of the connecting electrode and the first data line is the same as an overlapping area of the compensation electrode and the second data line.

19. The LCD device of claim 16, wherein the pixel electrode further includes edge electrodes which connect ends of the branch electrodes and extend in the same direction as the first data line and the second data line.

20. The LCD device of claim 15, wherein capacitance formed between the pixel electrode and the first data line is the same as capacitance formed between the pixel electrode and the second data line.

* * * * *